United States Patent [19]

Hassan et al.

[11] 4,165,132
[45] * Aug. 21, 1979

[54] PNEUMATIC CONTROL OF THE MOTION OF OBJECTS SUSPENDED ON AN AIR FILM

[75] Inventors: Javathu K. Hassan, Hopewell Junction; John A. Paivanas, Hyde Park, both of N.Y.

[73] Assignee: International Business Machines Corporation, Armonk, N.Y.

[*] Notice: The portion of the term of this patent subsequent to Mar. 28, 1995, has been disclaimed.

[21] Appl. No.: 772,394

[22] Filed: Feb. 28, 1977

[51] Int. Cl.² .............................................. B65G 51/02
[52] U.S. Cl. ...................................... 406/10; 188/1 R; 188/356; 226/97; 271/183; 271/195; 406/84; 406/87
[58] Field of Search .................... 193/32, 40; 271/195, 271/182, 183, 229, 231; 188/356, 1 R; 302/2 R, 29, 31; 214/1 BE; 226/97

[56] References Cited

U.S. PATENT DOCUMENTS

| | | | |
|---|---|---|---|
| 3,158,367 | 11/1964 | Tarbuck | 271/97 |
| 3,285,608 | 11/1966 | Lyman | 271/195 |
| 3,796,466 | 3/1974 | Lasch | 302/29 |
| 3,933,351 | 1/1976 | Mayer et al. | 271/183 |
| 3,976,329 | 8/1976 | Adams et al. | 302/2 R |
| 4,081,201 | 3/1978 | Hassan et al. | 302/2 R |

OTHER PUBLICATIONS

IBM Technical Disclosure Bulletin; vol. 16, No. 2; Jul. 1973; "Air Track Buffer" by Babinski; pp. 469–470.
IBM Technical Disclosure Bulletin; vol. 18, No. 2; Jul. 1975; "Back Pressure Sense Circuit" by Appenzeller; pp. 422–424.

Primary Examiner—Jeffrey V. Nase
Attorney, Agent, or Firm—James E. Murray

[57] ABSTRACT

This specification deals with the stopping, positioning, orienting and redirecting a semiconductor wafer being transported along a track on an air film or bed of air. The stopping mechanism is an air jet located in a groove in the track, wafers passing over this air jet on an air film are sensed by a pneumatic sensor that turns on the air jet to set up an air stream under the transporting surface of the air film. This air stream sucks the fluid in the air film along with it in the groove causing a vacuum in the bed in the area of the nozzle of the air jet. The wafers are then stopped by the suction of the vacuum. Positioning, orienting and redirecting is done using the air jet and pneumatic sensor in combination with special air jet arrangements and operations.

3 Claims, 20 Drawing Figures

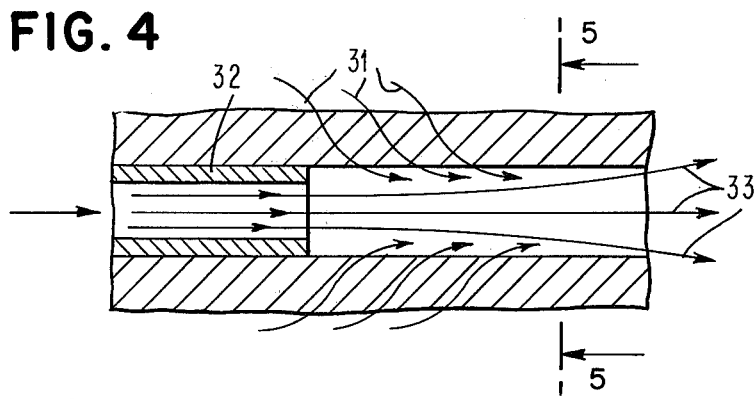
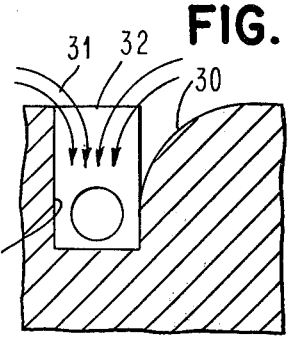
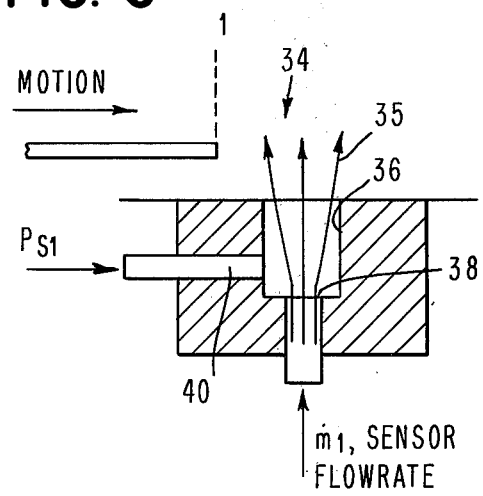
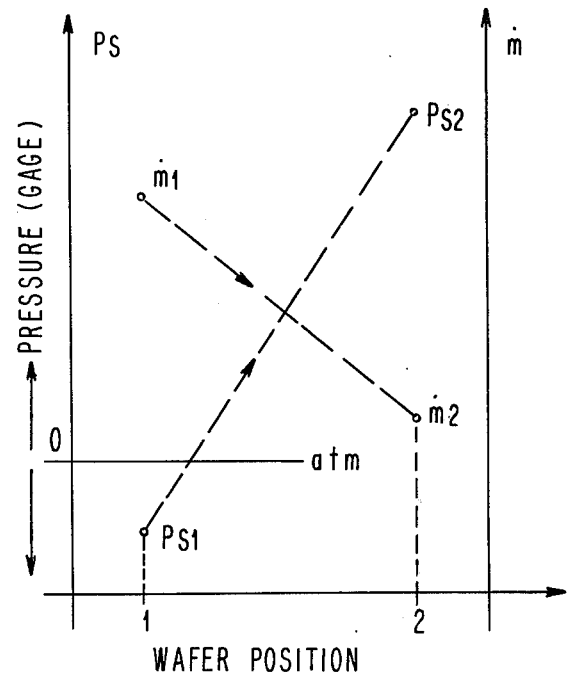
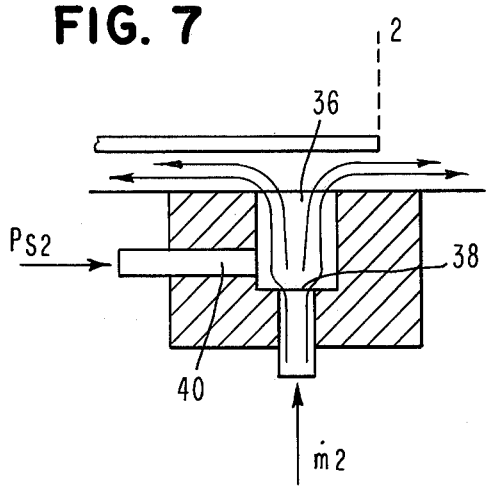
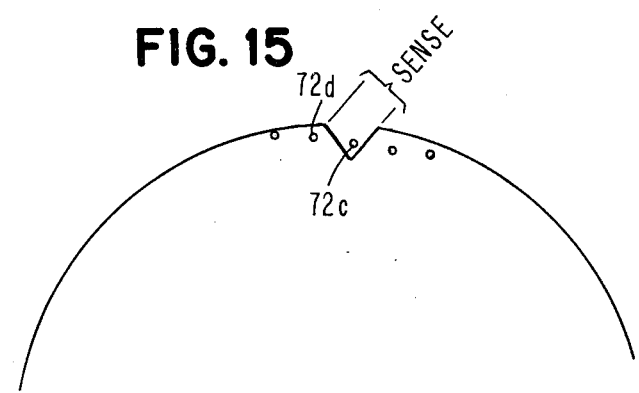

PNEUMATIC CONTROL OF THE MOTION OF OBJECTS SUSPENDED ON AN AIR FILM

BACKGROUND OF THE INVENTION

The present invention relates to the stopping of objects such as semiconductor wafers that are being transported along a track on an air film. In particular it relates to a method and mechanism for stopping and holding an object at a particular point along the track.

Co-pending U.S. patent application Ser. No. 754,306, filed on Dec. 27, 1976, assigned to the same assignee as this invention and entitled, "Wafer Air Film Transportation System" now U.S. Pat. No. 4,081,201 discloses a track configuration in which the air film supporting objects such as semiconductor wafers being moved along the track is controlled by the configuration of the track to eliminate the need of a wafer guide or restraint to keep the wafers on the track. In such systems it is not only desirable to transport the wafer, it is also necessary at times for the wafer to be stopped, reoriented and/or redirected. Again when these functions are being performed, it is desirable that the wafer not be contacted to any great extent by solid objects since such contacting of the wafer may cause damage to the circuits on the wafer resulting in lower yield rates of good circuits on the wafer. Therefore there is a need for a mechanism that will stop, hold, orient and change directions of wafers traveling along a track on an air film with a minimum of physical contact to the wafer by solid objects.

THE INVENTION

In accordance with the present invention, this mechanism is provided by placing what will be referred to as a stop or aspirating jet in a groove in the track to set up an air stream under the transporting surface of the air film. The air stream sucks the fluid in the air film along with it in the groove creating a vacuum in the air film around the nozzle of the air jet. Wafers passing over the nozzle are stopped by the suction of the vacuum.

The stop air jet can be turned on and off in conjunction with other driving, positioning and reorienting jets by one or more sensors such as sensing air jets that set up vertical air streams. A wafer passing over one of these vertical streams causes a pressure change in a bleeder passage in the nozzle of the particular sensing jet. Pressure in this bleeder passage controls a valve that regulates the air supply to the stop jet thereby regulating the vacuum around the stop jet nozzle.

Therefore it is an object of this invention to provide a mechanism for stopping an object such as a semiconductor wafer as it is moved along an air track transportation system.

A second object of the invention is to provide a mechanism for stopping such an object without contacting the wafer with probes or other solid objects.

It is also an object of the present invention to provide a mechanism for reorienting, redirecting and/or holding transported objects at points along an air track.

It is another object to provide a mechanism for sensing the presence of a transported object at one or more points along the track.

THE DRAWINGS

These and other objects of the invention will be apparent from the drawings of which:

FIG. 1 is a top view of a piece of air track with stop air jets of the present invention in grooves of the track.
FIG. 2 is a section taken along line 2—2 in FIG. 1.
FIG. 3 is a section taken along line 3—3 in FIG. 1.
FIG. 4 is an exploded view of the air track of FIG. 1 around one of the stop air jets.
FIG. 5 is a section taken along line 5—5 in FIG. 4.
FIGS. 6 and 7 show a sensor for sensing a wafer as it passes over the sensor on an air film.
FIG. 8 is a diagram explaining the operation of the sensor.
FIG. 9 is a schematic showing how a sensor would operate in conjunction with the air jet to stop the motion of a wafer.
FIG. 10 is one form of an intersection using the stop jet and sensor of the present application.
FIGS. 11 and 12 are plane views of another form of intersection using the stop jet and sensor of the present application.
FIG. 13 is a three-dimensional view of a contactless orientator using another form of intersection with the stop jet of the present invention.
FIG. 14 is a top view of FIG. 13.
FIGS. 15, 16 and 17 are schematics explaining the fiber optics for sensing the wafer.
FIG. 18 is a circuit schematic for the orientator of FIG. 13.
FIGS. 19 and 20 are side views of a support showing how it can be raised to contact the wafer.

DESCRIPTION OF THE DRAWINGS

As explained in the first mentioned co-pending application, a wafer 12 suspended on an air film of fluid which is fed to the top surface 16 of a track 14 from air manifolds 18 in the track through nozzles with long, thin passages 20 arranged in six rows positioned symmetrically around the center line 24 of the track. These passages are inclined with respect to the vertical at an angle, $\gamma$, in the track of the center line and an angle, $\theta$, in the direction of motion of the wafer along the track. An exhaust channel 26 is formed in the track on the centerline side of each row of nozzles 20. Channels 26 are asymmetrical in cross section. The wall 28 towards the center is vertical and straight while the external wall 30 is curved with a radius r and terminates longitudinally with the top surface of the track. As explained in the above mentioned co-pending U.S. application, Ser. No. 754,306, because of a combination of physical phenomena referred to as axi-radial and Coanda effects this arrangement establishes an air film which causes objects such as semiconductor wafers 12 to travel along the track in stable fashion in a direction determined by the angle $\theta$ of inclination of the passage 20.

In accordance with the present invention a mechanism is provided which enables stopping the wafers at any preselected point along the track. For this purpose one or more air jets 32 are placed in the bottom of one or more of the exhaust channels 26 in the track 14 for directing a jet of air along the channel 26 floor. As shown in FIGS. 4 and 5, this causes air or fluid 31 from the film above the air jet 32 to be sucked down into the channel 26 and along the channel in the direction of the jet stream 33 causing a perturbation in the air film or bed around the air jet 32 in the form of a vacuum. When a wafer passes over this vacuum, suction on the wafer by the vacuum causes the wafer to stop. The wafer will remain stopped until the air jet is turned off. This releases the wafer to again proceed down the track under the control of the air film set up in the axi-radial and Coanda effects described in the above mentioned co-pending application.

A new sensor 34, utilizing the axi-radial flow phenomenon is provided to control the turning on and turning off of the stop air jet 32. This sensor is located in the top surface 16 of the track and as shown in FIGS. 6 and 7 emits a vertical air stream 35 from a cavity 36 fed through a supply channel 38 and monitored by a sensor channel 40. The cavity may be cylindrical in form or it may be conically shaped with the truncated end of the cone opening on the track surface. As shown in the diagram of FIG. 8, when there is no wafer on the track over the sensor, the pressure in the sensing channel is low, $P_{s1}$. When the wafer passes over the sensor 34, the pressure in the sensor channel 40 increases dramatically to $P_{s2}$. This pressure differential is due to the telegraphed effect of a pressure change at the surface 16 of the track around the jet 34. When the jet is unobstructed by a wafer there is a slight vacuum in the lower portion of the supply channel 36 due to the diameter difference of supply channels 36 and 38. However, when a wafer passes over the jet a sudden suction region is generated at the surface 16 of the track around the jet 34. This is due to the axi-radial flow phenomena associated with the deflection of the jet by the wafer. This engendered condition at the track surface is reflected by an associated increase in pressure which is detected in passage 40 to the sidewall 36 of the enlarged opening for the jet.

Figure 1:
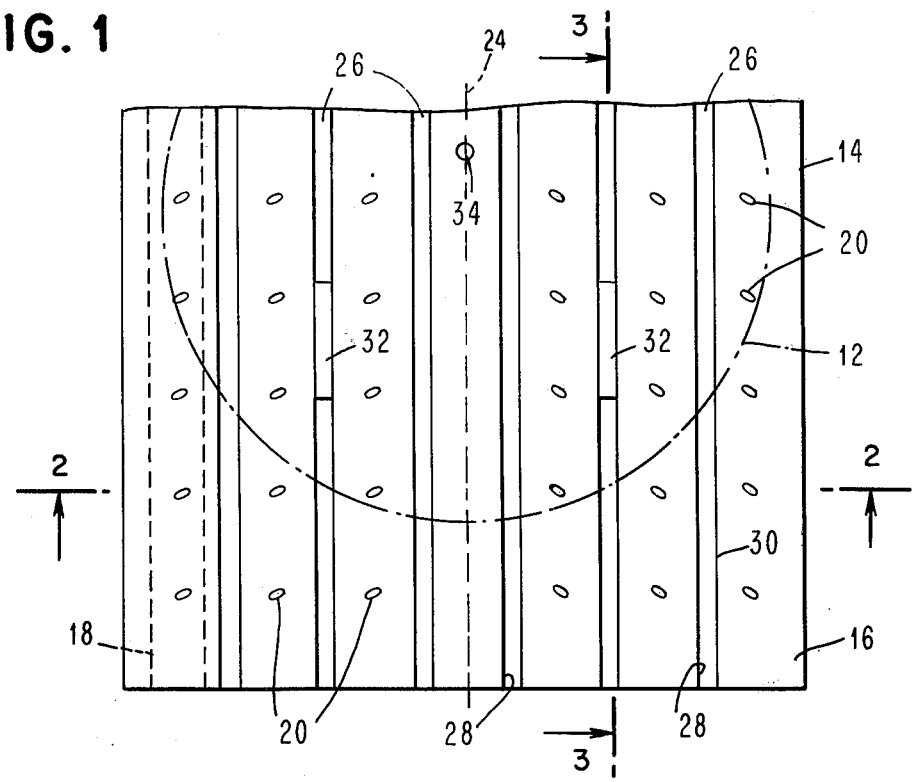
Figure 2:
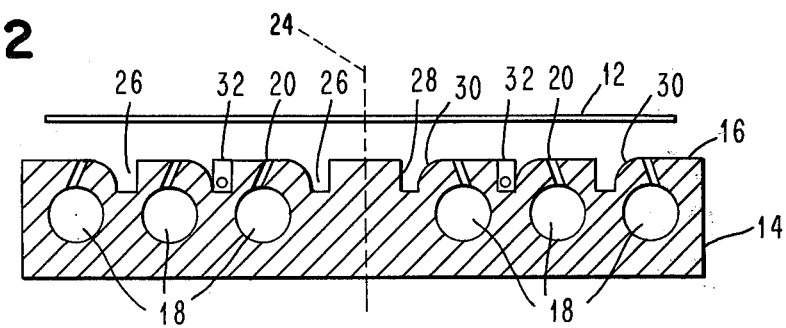
Figure 3:
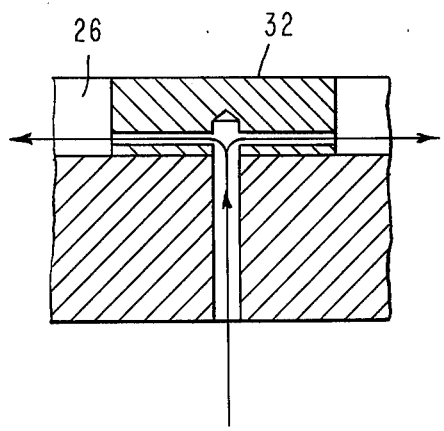

When the wafer is in position 58, the aspirating jets 32 are turned off by opening vent valve 65 and driver jets 64d come on and drive the wafer in the selected direction. Four driver jets 64 are supplied air through independently controlled paths so that the wafer can be sent in any one of the four directions of the intersections by turning two of the driver jets 64 on. For instance, turning jets 64a and 64b on will cause the wafer to move in the direction of arrow 66.

Figure 10:
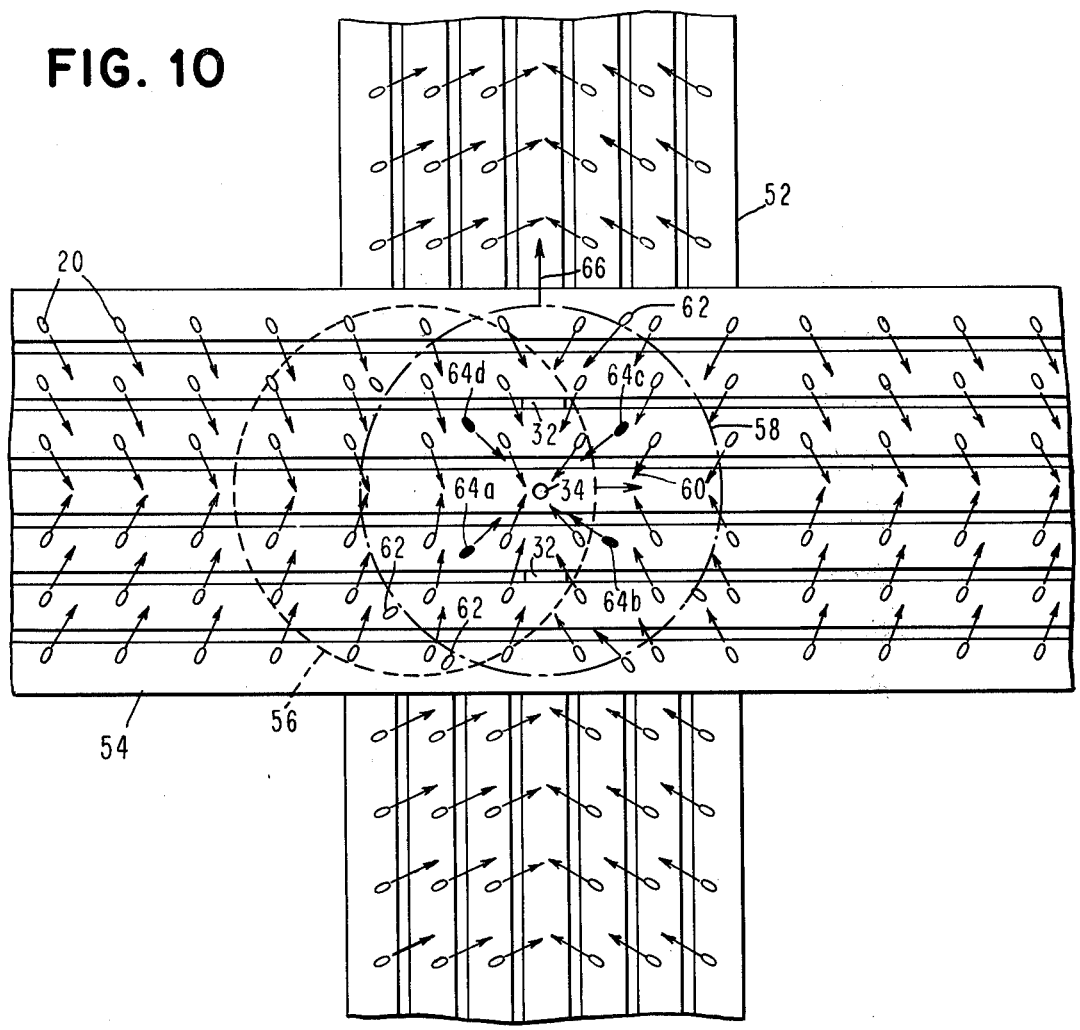
FIG. 10 shows two intersecting sections 52 and 54 of a track 14 having such a sensor and aspirating jets connected as shown in FIG. 9 to stop the wafer in the intersection. The aspirating jets 32 are normally off. When a wafer enters the intersection it eventually passes over sensor 34, the sensor opens a valve to allow air under pressure to reach the aspirating jets stopping the wafer in position 56. A vent valve 64 is then opened to interrupt the air supply to the aspirating jets by closing valve 42. The aspirating jets 32 then release the suction exerted on the wafer so that the wafer will move to position 58 under the influence of the film jets for the fluid layer established in accordance with the above mentioned co-pending U.S. patent application, Ser. No. 754,306. It will be noted that the angle of inclination of the passages 20 changes on track section 54 in the area of the intersection of sections 52 and 54. This is evidenced by the direction of arrows 60. From these arrows it should be apparent that the air film or fluid layer tends to direct a stopped or slow moving wafer to center itself in position 58 at the center of the intersection. Additional jets 62 around the periphery of this position 58 aid in centering the wafer into position 58 by exerting a centering force on the edge of the wafer. Vent valve 65 can be open and shut in a repeating sequence to pulse the stop or aspirating jet 32 off and on a number of times while the wafer moves from position 56 to position 58. This will periodically grab and release the wafer to damp and stabilize the motion of the wafer as it moves into position 58 considerably reducing the time it takes for the wafer to get from position 56 to position 58.
Figure 9:
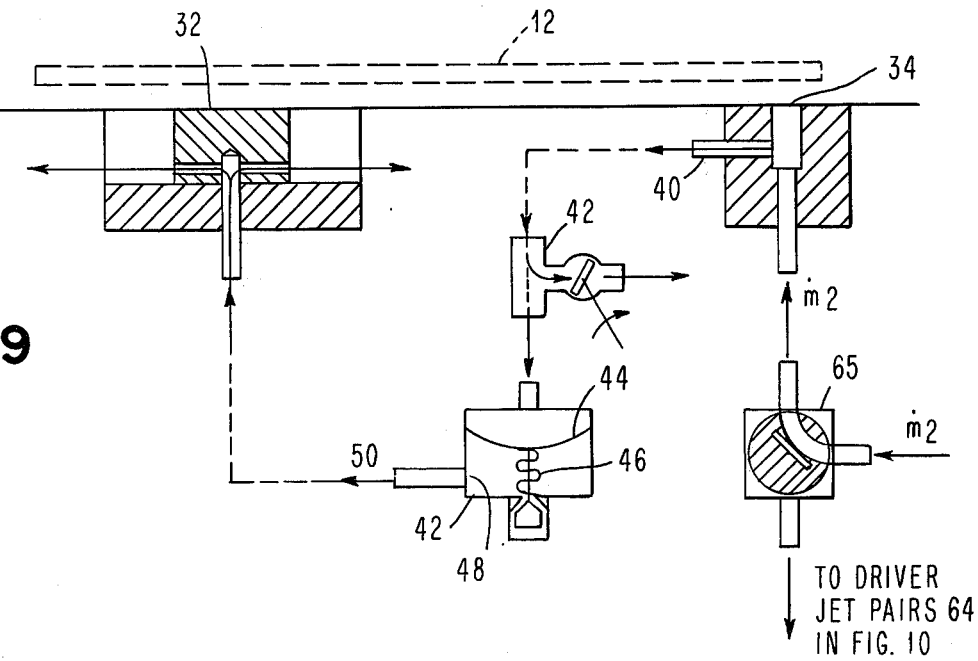
As illustrated in FIG. 9, this difference in pressure $P_{s2}-P_{s1}$ is used to control a valve 42 that regulates the supply of air to the aspirating or stop jet 32. The valve 42 can be one of a number of pressure sensitive valves, examples of which may be found in a catalog entitled, "Northeast Fluidics Sensing And Interface Valves And Components," copyright 1973 by Clippard Instrument Company, Inc. For the purpose of this application we will assume this valve 42 has a diaphragm 44 which, under action of a spring 46 normally seals the opening of a supply channel 48 blocking the path 50 from the supply to the stop jet 32. However, when the pressure in the sense line 40 increases to $P_{s2}$, the diaphragm 44 is moved by the air pressure against the action of the spring to open the path 50 from the supply to the jet 32. While the sense jet 34 is used in this embodiment because of its desirable characteristics, other sensing elements can be used to control the stop jet 32 such as electro-optic detectors and different types of pneumatic sensors such as the one found on page 20 of the above mentioned catalog.
Figure 11:
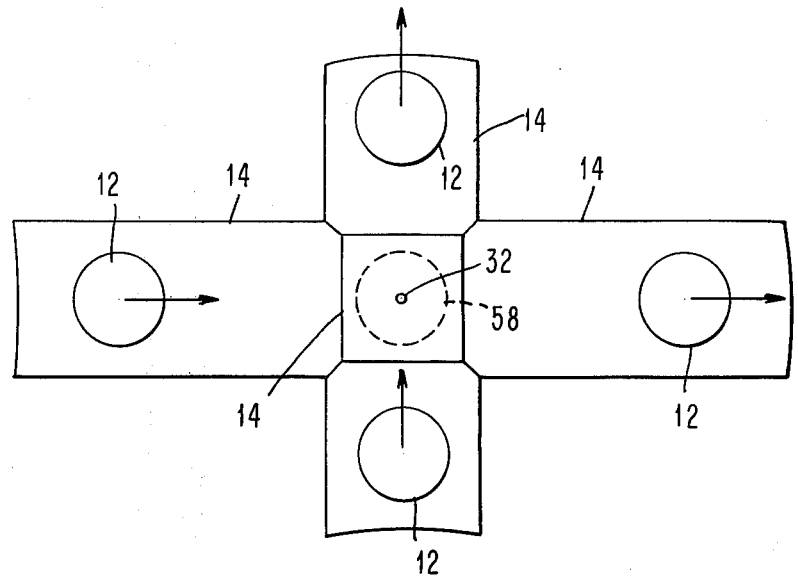
Figure 12:
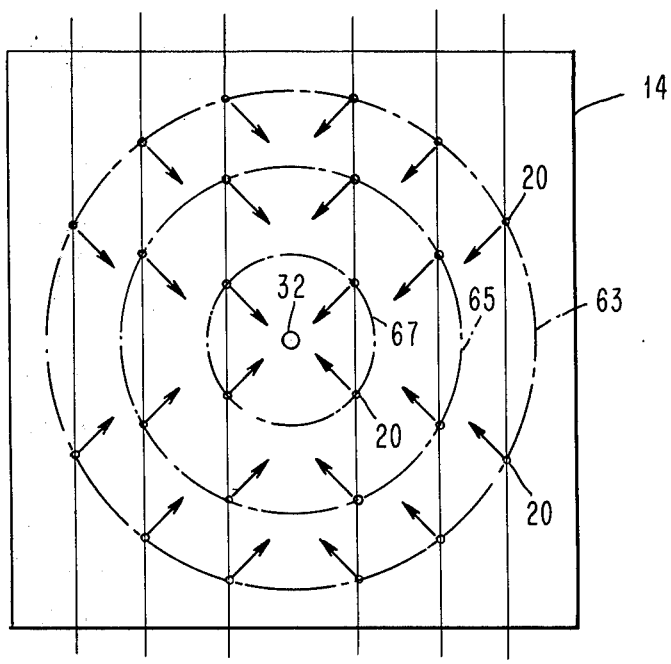

The intersection shown in FIGS. 11 and 12, like the intersection shown in FIG. 10, consists of a section of track like that of FIG. 1 where six rows of passages 20 are separated by channels. However, here the passages 20 are arranged in three concentric circles instead of being equally spaced as they are in FIG. 1. The diameter of circle 63 is larger, by approximately two film hole diameters, than the diameter of a 3¼ inch semiconductor wafer. Similarly, the diameter of circle 65 is larger than a 2¼ inch wafer by the same amount. Now, when a 3¼ inch wafer is centered the passages 20 in circle 63 exert a peripheral force while the passages in circle 65 and 67 act as film passages. Similarly, when a 2¼ inch wafer is centered the passages of circle 65 exert a peripheral force while the passages of circle 67 act as film holes.

The film hole angles of all the holes are such that $\gamma° = \theta°$, hence, the associated angle in the plane of the surface is denoted by $\beta = 45°$. Thus the holes do not all point to the center but are optimized with respect to the channel locations. The angles for the passages 20 are as follows:

circle 67: $\gamma = \theta = 10°$, $\beta = 45°$
circle 65: $\gamma = \theta = 15°$, $\beta = 45°$
circle 63: $\gamma = \theta = 20°$, $\beta = 45°$.

The hole diameter and length are 0.0135 inches and about 0.072 inches, respectively. Other hole sizes are also used depending on the desired operating pressure.

The intersection of FIGS. 11 and 12 also includes sensors, and drivers like that of the intersection shown in FIG. 10. In addition rotary motion can also be imparted to the wafers by the inclusion, for example, of four diametrically opposite and oppositely directed jets ($\beta = 90°$) in the intersection. Another variation of this aspect is described in the orientor below.

Centering of wafers in this intersection is very rapid and requires only three to four aspirator on and off pulses for the wafer to move into position 58 from the position which it is first stopped by the aspirator. This rapid centering is due in large part to the particular angles of the air passages 20 and their use as both air film and peripheral holes. With this arrangement the fluid force $F_p$ acts in a planar direction while the vertical force $F_v$ is counteracted by the film attraction force. Thus, with such symmetric arrangement of passage $\Delta F_p = 0$ on the centered wafer.

Figure 14:
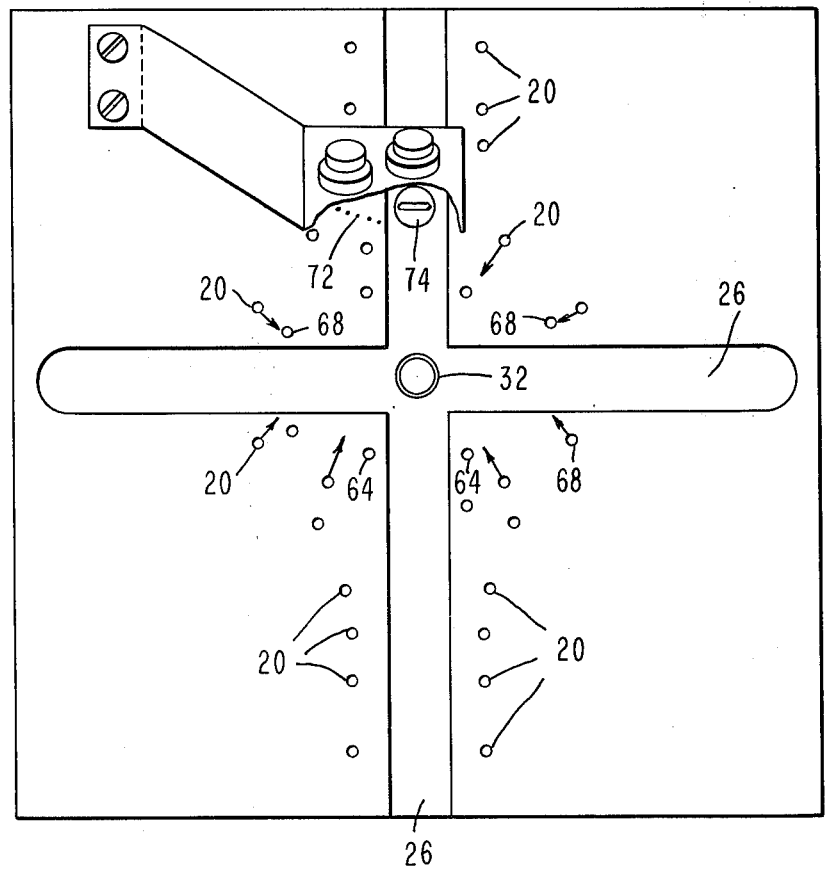
Figure 19:
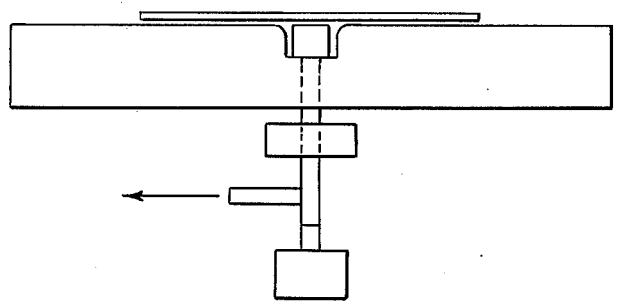
Figure 20:
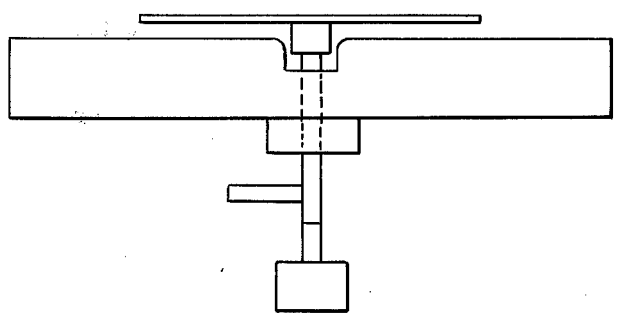

A third form of intersection is shown in FIG. 14. Here the air evacuating channels 26 form a pattern emanating from a cross and at the center of the cross is a four-way aspirating jet 32. This intersection has air film passages 20 in rows along the channels 26, passages to exert a peripheral force on the wafer 12 when it is in the centered position, and driver jets 64 just as the previous intersections. This type of intersection is suitable to be used for a wafer orientator. For this purpose jets 68, with $\beta = 90°$ are added to the intersection. These jets 68 exert a tangential force on the wafer 12 when the wafer is in position 58 causing the wafer to rotate in the clockwise direction. This occurs without impairing the basic wafer motion constraint properties of the supporting air film. The air jets 68 are supplied through the air film manifold along with the jets 20 so that they are on all the time the air jets and peripheral jets are on.

Figure 16:
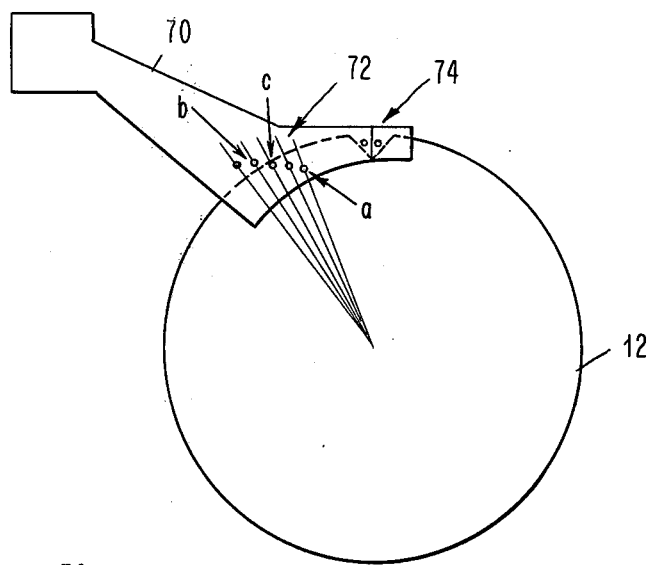
Figure 17:
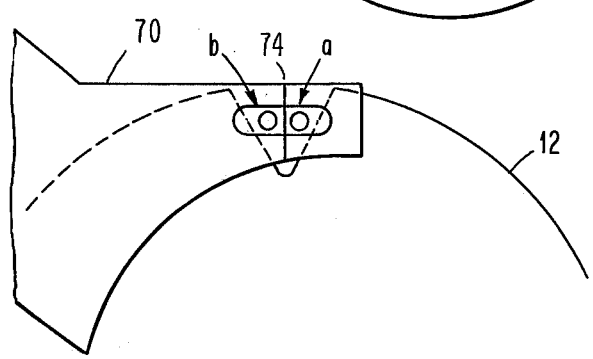

In accordance with co-pending application Ser. No. 772,393 filed on even date herewith, an electro-optic control arm 70 is used to control the positioning and orienting of wafer 12 in the intersection. As shown in FIGS. 15, 16 and 17, the optics for this system consist of rough and fine control sets of diodes 72 and 74 respectively. These diodes are used to sense both the edge of the wafer and a notch 76 in the wafer 12. Light normally shines on all the diodes in both sets from light sources mounted in the intersection 16. When a wafer enters the intersection in the direction of arrow 76 it passes under the arm 70 and comes in between the sets of diodes 72 and 74 and the electric lights positioned in the track cutting off light to the diode 72a, the first diode in set 72. Control circuits respond to the cutting off of light to diode 72a by opening the path 50 of air to the aspirating jet 32 and closing the bath of air to the air film and radial jets thereby stopping the wafer 12. Once the wafer is stopped, the aspirating jet is turned intermittently on and off so that the air film jets and the rotational jets can move the wafer while the aspirating jet is off. This centers the wafer in the position 58. In one specific mode of operation, the turning on and off of the aspirator is done in a sequence of eight steps and with each successive step of the sequence, the period of time the aspirator is off diminishes from 500 to 130 milliseconds while the period the aspirator is off remains about 50 milliseconds. This quickly stabilizes the wafer at its desired position. After the count of eight, air supplied to the jet 32 is turned off so that jogging of the wafer by the aspirator stops and the wafer rotates freely in position 58 until the notch 76 passes under the rough orienting diode set 72 of five diodes. When one of these diodes 72c senses light while an outer diode 72d is still blocked from the light source by the wafer it is an indication that the notch is in the rough position and the aspirator is again turned on and off; this time in fixed increments until the fine diodes 74 are both exposed to light through the notch. When the light is impinging, the diodes 74 generate a specific voltage relationship in the circuits shown in FIG. 18 and described hereinafter and the wafer is in position so the aspirating jet is turned on and the air film feed is turned off.

With the wafer properly oriented readings can then be performed on the wafer or the oriented wafer can be transferred to a manufacturing station by a transfer mechanism such as a Burnulli/head. When the function to be performed is completed, the aspirator jet is turned off and the wafer ejected from the intersection in any direction by driver jets 64.

In taking a reading it may be difficult to read accurately because the wafers are warped. For this purpose a support 80 is provided. This support is normally recessed in the floor of one of the grooves of the intersection so it does not contact wafers being over it or interfere with the wafers' motion. However, by the use of air pressure this support can be raised to contact the wafer and a vacuum applied in the area to be read to straighten the wafer to make it readable.

Figure 18:
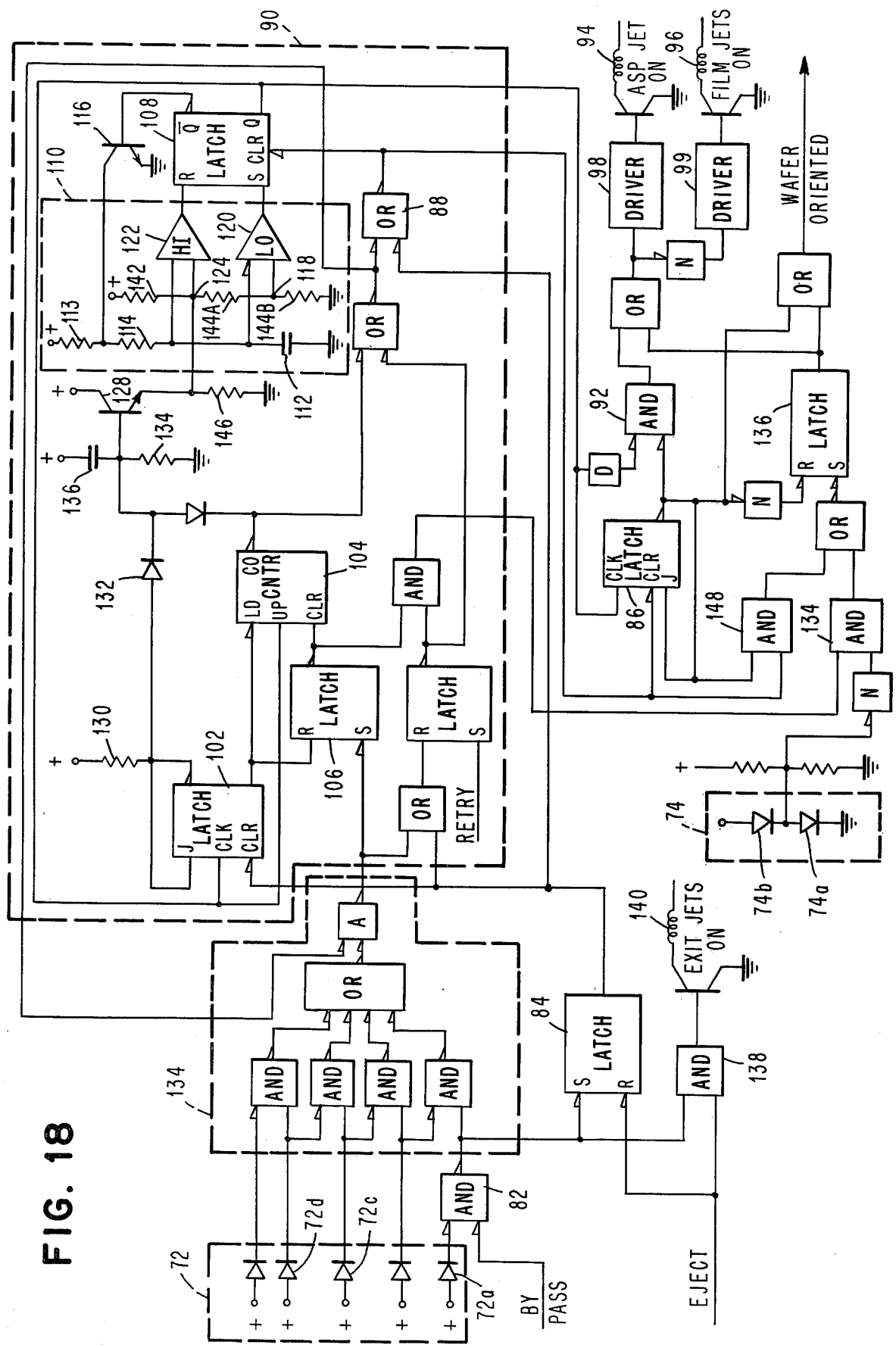

Referring to FIG. 18, it can be seen how the circuitry works to operate the jets as responses to the electrical signals from the diode steps 72 and 74. Initially, the film jet control coil 96 is energized while the aspirator and exit jet control coils 94 and 140 are de-energized. This means that air is being supplied to the film jets, and the rotational jets, while the air supply to the aspirating jets and the exit jets are held off. When diode 72a is cut off from the light source by wafer 12, AND gate 82 sets wafer present latch 84. The output of the wafer present latch through OR gate 88 then removes the clear from the wafer stop latch 86 and the pulse generator latch 108 and also enables AND gate 148 turning the aspirator jet on and the film jets off by supplying electrical power to the aspirator jet control coil 94 and turning off electrical power to film jet control coil 96.

The pulse generator latch 108 is controlled by a timing circuit 110 having a capacitor 112 and resistors 113 and 114 that sets the basic timing for the oscillator circuit 110. Initially the output of the pulse generator latch is Lo and transistor 116 is conducting, holding capacitor 112 discharged through resistor 114. As pointed out previously, when the clear input to oscillator latch 108 goes high the oscillator latch becomes active turning transistor 116 off. Now capacitor 112 can charge. Before capacitor 112 charges, the voltage across it is below the potential at point 118. Therefore the output of the Lo detector 120 sets the latch 108. This causes the output of the oscillator latch 108 to go high and voltage across capacitor 112 begins to rise until its input to the Hi detector exceeds the voltage at point 124 resetting the latch so that the output of the latch 108 goes low, and also turns on transistor 116 discharging capacitor 112, dropping the voltage across capacitor 112 below the voltage at point 118 causing the output of the Lo voltage detector 120 to go up and set the latch. With the latch set the output goes hi and also turns off transistor 116, starting another cycle. Thus once the clear signal is removed from the latch 108, the output of the pulse generator latch oscillates.

The period of pulse repetition and the ratio of on to off time is determined by the voltage at point 124. The voltage at point 124 and 118 is controlled by the conduction of transistor 128. Transistor 128 is normally held conducting by positive potential fed through resistor 130, diode 132 to the base of transistor 128 holding the base up and therefore the potential point 124 high. However, when the oscillator latch 108 goes through one cycle it sets the first pulse latch 102. When the first pulse latch is set, the diode 132 is back biased and the voltage at the emitter of transistor 128 starts to drop due to RC time constant of resistor 134 and capacitor 136. At some point the capacitor will charge sufficiently to turn off transistor 128. With transistor 128 off, the on time of the generator is determined by the voltage divider action of transistors 142, 144 A & B and 146. The on time of the latch varys from 500 milliseconds when transistor 128 is turned off to 130 milliseconds when transistor 128 is off, while the off time stays relatively constant at approximately 50 milliseconds. The change in the on time of the oscillator occurs over eight on/off cycles of the oscillator. A counter 104 counts each off pulse and when eight is reached it carrys. The carry signal Co clears the pulse generator latch 108 and latch 86. While the pulse generator latch was in the sequence of eight pulses it was turning the aspirator jet and the film jets on and off out of phase with each other centering the wafer with a jogging motion. First the wafer is allowed to move towards its centered position under the influence of the air film rotational and peripheral jets. Then those jets are turned off and the aspirator is turned on stopping the wafer. With each cycle the amount of time the film, rotational and peripheral jets are on, is reduced. This quickly centers the wafer into position 58 with a minimum of overshoot. After the count of eight and the latches 108 and 86 are cleared the aspirator jet is turned off and the wafer rotates in its centered position on the air film under the influence of the rotational jets until the notch 76 passes between the fast sense diode set 72 and the light source illuminating them. When the notch 76 allows light to reach any one of the diodes 72c and causes it to conduct while a diode 72d further from the position of 72a is blocked from the light source and therefore is not conducting, detection circuit 134 provides a signal that sets the latch 106 clearing the counter 104. With the counter 104 cleared, the Co output of the counter goes up and allows the latch 108 to pulsate. This time with transistor 128 held non-conducting so that the pulsing has a fixed on period of 130 milliseconds. The wafer now rotates more slowly and precisely until the notch 76 passes between the final sense diodes 74. When that happens both diodes 74a and 74b conduct. When diode 74a conducts sufficiently more than diode 74b the voltage across diode 74a turns on the AND gate 134, and sets the final notch latch 136 turning the aspirator on and the film jets off to hold the wafer in its oriented position.

A signal is sent to the reading equipment indicating that the wafer is oriented. The information can be then read and after the reading is complete, the reading equipment provides an eject signal to an AND gate 138 energizing the exit jet control coil 140 and thus turning the exit jets on. At the same time it sends a reset pulse to the wafer present latch 84 resetting the control circuitry and turning the aspirator jet off and the film jets on. Thus the wafer is expelled from the intersection and the equipment is ready to orient the next wafer to enter the intersection.

Figure 13:
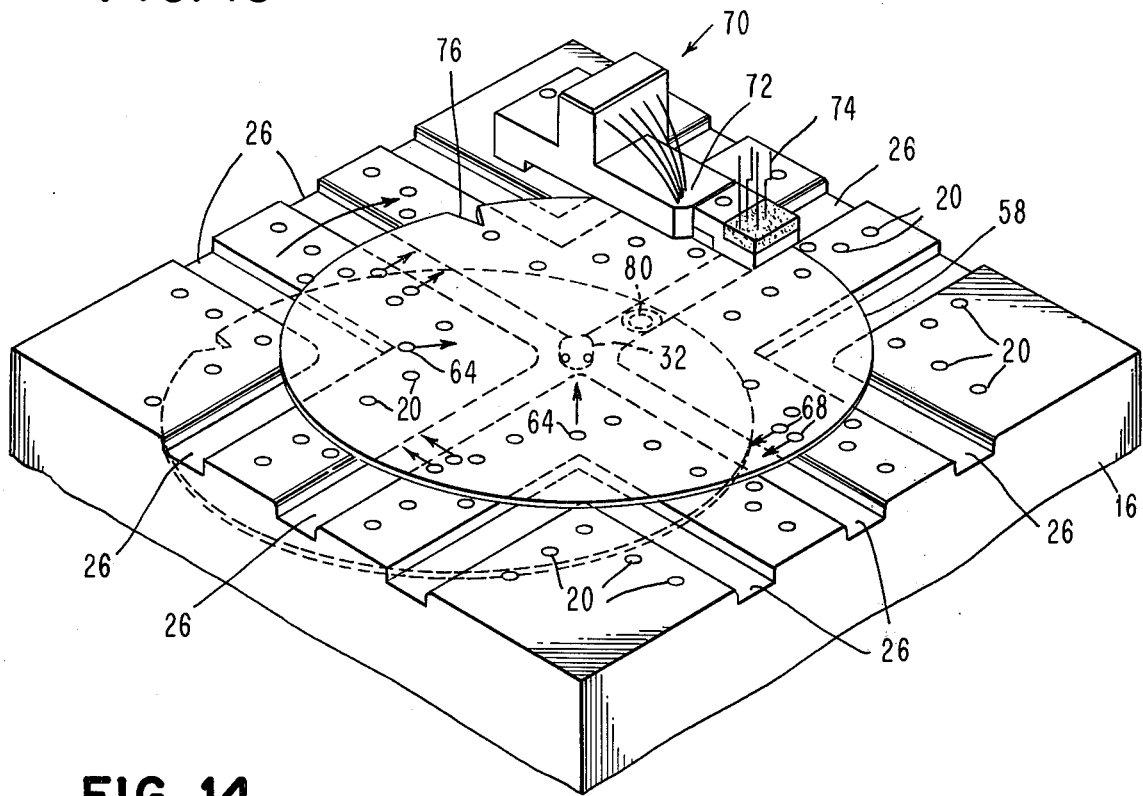

While the intersection of FIG. 13 operates to orient, it has been found that it is much more sophisticated than needed for the orienting purpose and the form of the intersection shown in FIG. 14 is less expensive and simpler. Here the number of channels and jets are reduced and the diodes are placed in the track instead of in the arm. The arm then contains the light sources to activate the diodes. All the jets described herein are axi-radial which are of the type described in co-pending application Ser. No. 754,306.

Therefore it should be obvious to those skilled in the art that many changes can be made in the above embodiment of the invention without departing from the spirit of the invention and the scope of the claims.

What is claimed is:

1. Apparatus for stopping an object such as a semiconductor wafer as it moves relative to the surface of a track on a fluid film comprising:
   strings of openings in the surface of the track along the axis of movement of the wafer across the track to supply fluid for the fluid film,
   an exhaust channel which is many times longer than the length of the object being transported and is oriented parallel to the strings of openings in the surface of the track to allow excess fluid from the film to be removed from the track to establish a film for transporting the wafer,
   a nozzle emitting a fluid jet in at least one direction along the channel at a sufficient pressure so as to draw fluid from the film along with it into the channel to cause a perturbation in the film in the form of a vacuum around the nozzle that will stop the object on the track.

2. The apparatus of claim 1 including sense means for sensing the presence of the object over the nozzle,
   fluidic control means coupled to the nozzle and the sense means for supplying fluid to the nozzle when the object is over the nozzle.

3. The apparatus of claim 2 wherein said fluid sense means comprises:
   a chamber in said track with a sidewall and floor which chamber ends flush at the surface of the track,
   an opening in the floor of the chamber emitting a fluid jet normal to the surface of the track so that it extends upward through the air film when there is no object over the chamber and is diverted along the track when an object is over the chamber,
   an opening in the sidewall of the chamber for reflecting pressure changes along the said wall of the chamber and the change in direction of the fluid jet brought about by the presence or absence of a wafer over the chamber,
   means responsive to the pressure of the opening.

* * * * *